（12) United States Patent
Schmitt et al.

(10) Patent No.: US 7,852,627 B2
(45) Date of Patent: Dec. 14, 2010

(54) SYSTEM AND METHOD FOR HIGH DENSITY INFORMATION HANDLING SYSTEM ENCLOSURE

(75) Inventors: Ty Schmitt, Round Rock, TX (US); Robert Riegler, Fenton, MO (US)

(73) Assignee: Dell Products L.P., Round Rock, TX (US)

( * ) Notice: Subject to any disclaimer, the term of this patent is extended or adjusted under 35 U.S.C. 154(b) by 172 days.

(21) Appl. No.: 12/263,005

(22) Filed: Oct. 31, 2008

(65) Prior Publication Data

US 2010/0110626 A1    May 6, 2010

(51) Int. Cl.
*H05K 7/20* (2006.01)
(52) U.S. Cl. ........................ 361/695; 361/694; 361/699; 454/184
(58) Field of Classification Search ........................ None
See application file for complete search history.

(56) References Cited

U.S. PATENT DOCUMENTS 6,665,582 B1 * 12/2003 Moritz et al. ............... 700/213
6,741,467 B2    5/2004 Coglitore et al.
6,859,366 B2 *  2/2005 Fink .......................... 361/690
7,278,273 B1   10/2007 Whitted et al.
7,508,663 B2    3/2009 Coglitore
7,511,960 B2    3/2009 Hillis et al.
7,738,251 B2 *  6/2010 Clidaras et al. ............. 361/701
2004/0100770 A1 *  5/2004 Chu et al. ................... 361/698
2006/0082263 A1 *  4/2006 Rimler et al. ............... 312/201
2008/0055846 A1 *  3/2008 Clidaras et al. ............. 361/687
2009/0021907 A1 *  1/2009 Mann et al. ................. 361/686
2009/0241578 A1 * 10/2009 Carlson et al. ............. 62/259.2

\* cited by examiner

*Primary Examiner*—Gregory D Thompson
(74) *Attorney, Agent, or Firm*—Hamilton & Terrile, LLP; Robert W. Holland

(57) ABSTRACT

An information technology enclosure has a processing subsystem and infrastructure subsystem in separate shipping containers that cooperate to process information. The processing subsystem has increased information processing density by concentrating information handling systems in a first processing shipping container that is supported with infrastructure equipment in a second infrastructure shipping container. In one embodiment, the shipping containers are arranged in a stacked configuration so that cooled air and exhausted air are exchanged through aligned vents formed in the ceiling and floor of stacked shipping containers.

20 Claims, 15 Drawing Sheets

SYSTEM AND METHOD FOR HIGH DENSITY INFORMATION HANDLING SYSTEM ENCLOSURE

CROSS REFERENCE TO RELATED APPLICATIONS

U.S. patent application Ser. No. 12/263,069, entitled "System and Method for Vertically Stacked Information Handling System and Infrastructure Enclosures," inventors Ty Schmitt and Robert Riegler, filed on Oct. 31, 2008, describes exemplary methods and systems and is incorporated by reference in its entirety.

U.S. patent application Ser. No. 12/263,024, entitled "System and Method for Vertically Stacked Information Handling System and Infrastructure Enclosures," inventors Ty Schmitt and Robert Riegler, filed on Oct. 31, 2008, describes exemplary methods and systems and is incorporated by reference in its entirety.

U.S. patent application Ser. No. 12/263,062, entitled "System and Method for Vertically Stacked Information Handling System and Infrastructure Enclosures," inventors Ty Schmitt and Robert Riegler, filed on Oct. 31, 2008, describes exemplary methods and systems and is incorporated by reference in its entirety.

BACKGROUND OF THE INVENTION

1. Field of the Invention

The present invention relates in general to the field of information handling system manufacture, use, and distribution, and more particularly to a system and method for configuration of information handling systems as mobile information technology systems.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Increases in the capabilities of information handling systems and networking technologies has led to an increasing reliance by businesses and other enterprises on information handling systems to perform a variety of tasks. Often, information handling system servers are placed in a building or room that has specialized power and cooling equipment to help ensure a compatible environment for the systems. As examples of specialized power needs, a concentration of information handling systems often consume a considerable amount of power, typically require a steady and reliable power supply and typically have backup power sources in the event that a main power source is interrupted. As examples of specialized cooling needs, a concentration of information handling systems often produces a considerable amount of heat as a byproduct of their operation and typically has dedicated cooling systems to remove the heat. Often, enterprise information technology specialists employ an over-kill approach when purchasing and installing infrastructure for an information handling system data center. For example, cooling systems typically are purchased and installed that have excess cooling capacity to provide a margin of error. Extra cooling capacity also provides infrastructure to accommodate growth in the number of systems that it supports. Similarly, information handling system data center rooms are often built with unused space so that additional information handling systems may be added over time. Typically, as enterprise information handling system needs grow, enterprises add and replace existing systems; thus, maneuvering room is generally needed within a data center room to service existing systems of the data center. Data centers face considerable infrastructure costs if existing cooling, power and space in a data center become inadequate to handle enterprise information processing needs.

A recent industry trend seeks to simplify the set up and operation of a data center by installing all or most of the elements of the data center in one or more mobile modules, such as shipping containers. Two examples of such systems are the BLACK BOX manufactured by SUN MICROSYSTEMS and the ICE CUBE manufactured by RACKABLE SYSTEMS. Information handling systems are installed in a shipping container along with cooling, power and networking infrastructure. The shipping containers conform to standards designed for shipping freight through intermodal transportation infrastructure, such as ISO standards. For example, a typical shipping container has a length of forty feet, a width of eight feet and a height of nine feet and six inches. Five common ISO standard shipping container lengths are twenty, forty, forty-five, forty-eight and fifty-three feet, although a variety of other sizes may also be used. The shipping container is shipped as normal freight so that, when the shipping container arrives at its destination, the information handling systems are ready to operate within the container. Although shipping container solutions provide the enterprise with improved flexibility in setting up a data center building by essentially providing the building, i.e., the shipping container, with the information handling systems, existing shipping container solutions continue to share the problems faced by conventional data centers with respect to power consumption and cooling. One type of shipping container solution attempts to include cooling, power and networking infrastructure with the information handling systems in a common shipping container. Such solutions face difficulty in manufacture due to the variety of different types of components that are assembled, and difficulty in deployment since a module generally must include cooling resources for a variety of different climates. U.S. Pat. No. 7,278,273 describes cooling modules that are shipping containers having HVAC equipment and that are separate from a shipping container that has information handling systems; however, air movers for moving cold air are included with the information handling system shipping container, with each air mover providing air to an isolated portion of information handling systems. The addition of the air movers with the information handling systems tends to reduce the space available for information handling systems and to increase the complexity of assembly of the shipping module.

SUMMARY OF THE INVENTION

Therefore a need has arisen for a system and method which configures mobile information technology systems to provide greater computing density with more efficient infrastructure resource allocation.

In accordance with the present invention, a system and method are provided which substantially reduce the disadvantages and problems associated with previous methods and systems for mobile information technology systems. An information technology enclosure is built with a processing subsystem housed in a first shipping container and an infrastructure subsystem housed in a second shipping container. The processing subsystem has a high density of information handling systems supported in the first shipping container by distributing infrastructure equipment to the second shipping container. The information technology enclosure operates in the shipping containers in which the processing subsystem and infrastructure subsystem are built and shipped with the environment of the processing subsystem maintained by passive and active thermal management of the infrastructure subsystem.

More specifically, an information technology enclosure ships in shipping containers that are subsequently used to house a processing subsystem to process information and an infrastructure subsystem to support operation of the processing subsystem. The processing subsystem concentrates processing equipment in a first shipping container, such as by arranging racks in one or more rows that define intake portions and exhaust portions. Information handling systems are disposed in the racks to accept cooling airflow from the intake portion and to exhaust the airflow to the exhaust portion. The infrastructure subsystem includes one or more air movers in a second shipping container that output treated air to the intake portion of the first shipping container and receive exhaust from the exhaust portion of the first shipping container. For example, the first and second shipping containers stack in a vertical configuration to align vent openings that allow airflow between the air movers and the processing subsystem. The air movers support active thermal management with a coil that receives chilled water from a source external to the shipping containers with the air mover pressurization, airflow temperature and coil temperature managed by an environment controller. Under some circumstances, the environment controller uses passive thermal management, such as by actuating vents to allow external air into the shipping containers and/or to exhaust air from the shipping containers. Thermal management supported by the infrastructure subsystem, such as the size and capacity of the air mover and coils or the redundancy of the thermal transfer equipment, is built-to-order to support the information handling systems within the processing subsystem. The information handling systems are built-to-order to perform a common processing task, such as a search engine function or a data storage function.

The present invention provides a number of important technical advantages. One example of an important technical advantage is that a processing subsystem concentrates information handling systems in a shipping container for improved processing density while an infrastructure subsystem supports operation of the information handling systems with an efficient allocation of infrastructure equipment. Stacked configuration of the processing subsystem and infrastructure subsystem provides a convenient arrangement for communicating treated air to the information handling systems with a minimal footprint. The infrastructure subsystem shipping container treats air for use by the processing subsystem with active thermal management, such as by blowing air past, over or through a coil having chilled water supplied by an external source, or with passive thermal management, such as by actuating vents for receiving external air into or exhausting internal air from the processing or infrastructure subsystems, or by enabling an enthalpy wheel to aid in removal of heat from exhaust air within the processing or infrastructure subsystems. Information handling system racks are arranged in rows that define intake and exhaust portions of the processing subsystem to help force air through information handling systems.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information technology enclosure has plural information handling systems disposed in a processing subsystem shipping container and air mover and coil assemblies in an infrastructure container to provide a mobile, high-density data center. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
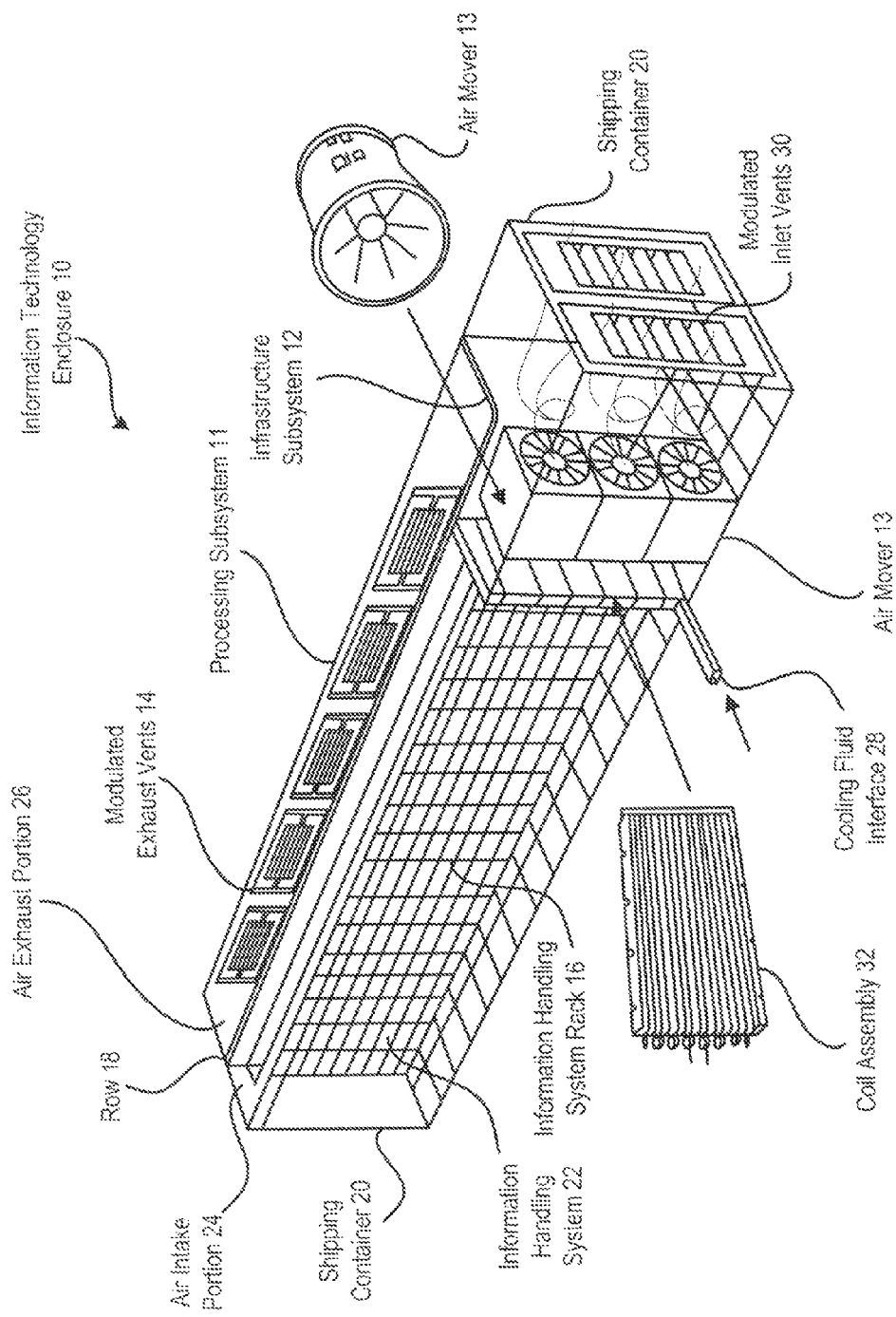
FIG. 1 depicts a perspective cutaway view of an information technology enclosure having processing subsystem and an infrastructure subsystem that incorporates air movers and modulated vents for closed loop cooling or air side economization.

Referring now to FIG. 1, a perspective cutaway view depicts an information technology enclosure 10 having a processing subsystem 11 and an infrastructure subsystem 12 that incorporates air movers 13 and modulated vents 14 for closed loop cooling or air side economization. Air movers 13 may be any of plural types of air movers, such as direct axial, plenum of impellor movers. Processing subsystem 11 has a plurality of information handling system racks 16 disposed in a row 18 within a shipping container 20. Shipping container 20 is built for use in a transportation infrastructure, such as with dimensions that fit on a semi-tractor trailer truck or a railroad car so that the shipping container 20 is delivered to an operating location to allow information handling systems 22 to operate within shipping container 20. Processing subsystem 11 ships with information handling systems 22 assembled in racks 16 and ready for operation when delivered to an end destination. Infrastructure subsystem 12 ships in a separate shipping container 20 from processing subsystem 11 or, alternatively, ships in a common shipping container with processing subsystem 11, although the shipping containers for processing subsystem 11 and infrastructure subsystem 12 may be of different sizes. In the example embodiment depicted by FIG. 1, racks 16 are blade chassis that hold plural blade information handling systems. Alternatively, racks 16 are standard sized data center racks that hold plural information handling systems 22. Although the present example embodiment depicts that a shipping container is used to contain processing subsystem 11 and infrastructure subsystem 12, in alternative embodiments alternative transportable enclosures might be used to contain a processing subsystem 11 and an infrastructure subsystem 12. Transportable enclosures include any type of structure that might be used to move contents, such as a structure that is moveable on a flat bed truck or railroad car, and then to contain the contents in an operational state at an end location. Such purpose built portable structures allow assembly of a processing subsystem 11 or infrastructure subsystem 12 within the structure at an assembly manufacture location, shipment of the structure to an end user location site, and operation within the structure at the end user location site without any substantial alterations made to the equipment held by the structure.

Row 18 divides shipping container 20 into two portions, an air intake portion 24 and an air exhaust portion 26, which are isolated from each other. For example, racks 16 extend from the floor to the ceiling of shipping container 20 so that air within air intake portion 24 travels to exhaust portion 26 substantially only through information handling systems 22. Infrastructure subsystem 12 couples to processing subsystem 11 at one end of shipping container 20 so that air movers 13 are aligned to blow air into intake portion 24 and receive air from exhaust portion 26. Air movers 13 move air to create an overpressure condition within air intake portion 24 to force cooling airflow through information handling systems 22 and into exhaust portion 26. The cooling airflow may be assisted by cooling fans operating within information handling systems 22, or information handling systems 22 may rely on the overpressure without the use of internal cooling fans, which may be selectively shut off to conserve power when overpressure cooling is adequate to maintain a desired thermal state, or which may simply not be present within information handling systems 22. Air moved from infrastructure subsystem 12 into air intake portion 24 passes across a coil assembly 32, which heats or cools the air as needed to maintain operation of information handling systems 22 at a desired operating temperature. Coil assembly 32 receives chilled (or heated) water from a cooling fluid interface 28 which couples to an external chilled water supply. In alternative embodiments, the cooling fluid may be chilled water, tap water, glycol, refrigerant, evaporative or other types of cooling fluids with various cooling techniques used alone or in combination to treat air provided to air intake portion 24. The overpressure in air intake portion 24 forces the cooled or heated air through information handling systems 22 and into air exhaust portion 26. As the air passes through information handling systems 22, thermal transfer brings the information handling systems to a temperature closer to that of the air. In one embodiment, motors attached to variable frequency drives or voltage output devices drive and regulate air movers and valves to control cooling fluid by adjusting valve positions in a combined coil and air mover assembly also referred to as an air handler. For example a coil and air mover assembly includes coils, air movers, motors, valves, control boards, variable frequency drives, sensors, humidity adders, controllable louvers/dampers and power, cooling fluid, and air signal inputs and outputs.

In operation, information technology enclosure 10 is shipped to a location having power, networking and HVAC resources. Information technology enclosure 10 is shipped with processing subsystem 11 and infrastructure subsystem 12 in a common shipping container or in separate shipping containers that are assembled at the end location. Power is applied to information handling systems 22, network resources are interfaced with information handling systems 22 and chilled or heated water is interfaced with coil assembly 32. An environment controller, discussed in greater detail in FIG. 7, monitors thermal conditions within processing subsystem 11 to maintain desired thermal constraints for operation of information handling systems 22. In some circumstances, thermal constraints are maintained with a closed loop thermal scheme that transports air internally between air intake portion 24 and air exhaust portion 26 with cooling or heating as needed by coil assembly 32. For example, a closed loop thermal scheme is used where conditions external to shipping container 20 are unfriendly to the operation of information handling systems 22, such as an external environment with a high ambient temperature. Alternatively air economization modifies the closed loop thermal scheme where external conditions are favorable to information handling systems 22, such as where the external environment ambient temperature is low. Modulated exhaust vents 14 and modulated inlet vents 30 open to varying degrees so that airflow passes from inlet vent 30 through information handling systems 22 and out exhaust vents 14. Vents 14 and 30 may operate independently and open to varying degrees based on ambient conditions to maintain temperatures of information handling systems 22 in a desired range. In ambient temperatures having extreme cold, vents 14 and 30 can remain shut so that heat released by information handling systems 22 recycles to maintain a minimum temperature within processing subsystem 11. In one embodiment, exhaust air and exterior air are mixed by opening exhaust vents and inlet vents to varying degrees so that the temperature of air in air intake portion 24 is regulated by the mixing. Modulated exhaust vents 14 actuate independently to help control airflow between information handling systems 22. For example, an exhaust vent 14 opens to a greater degree where the exhaust vent 34 is proximate an information handling system 22 having an elevated temperature so that a greater flow of cooling air passes through the information handling system 22 having the elevated temperature.

Figure 2A:
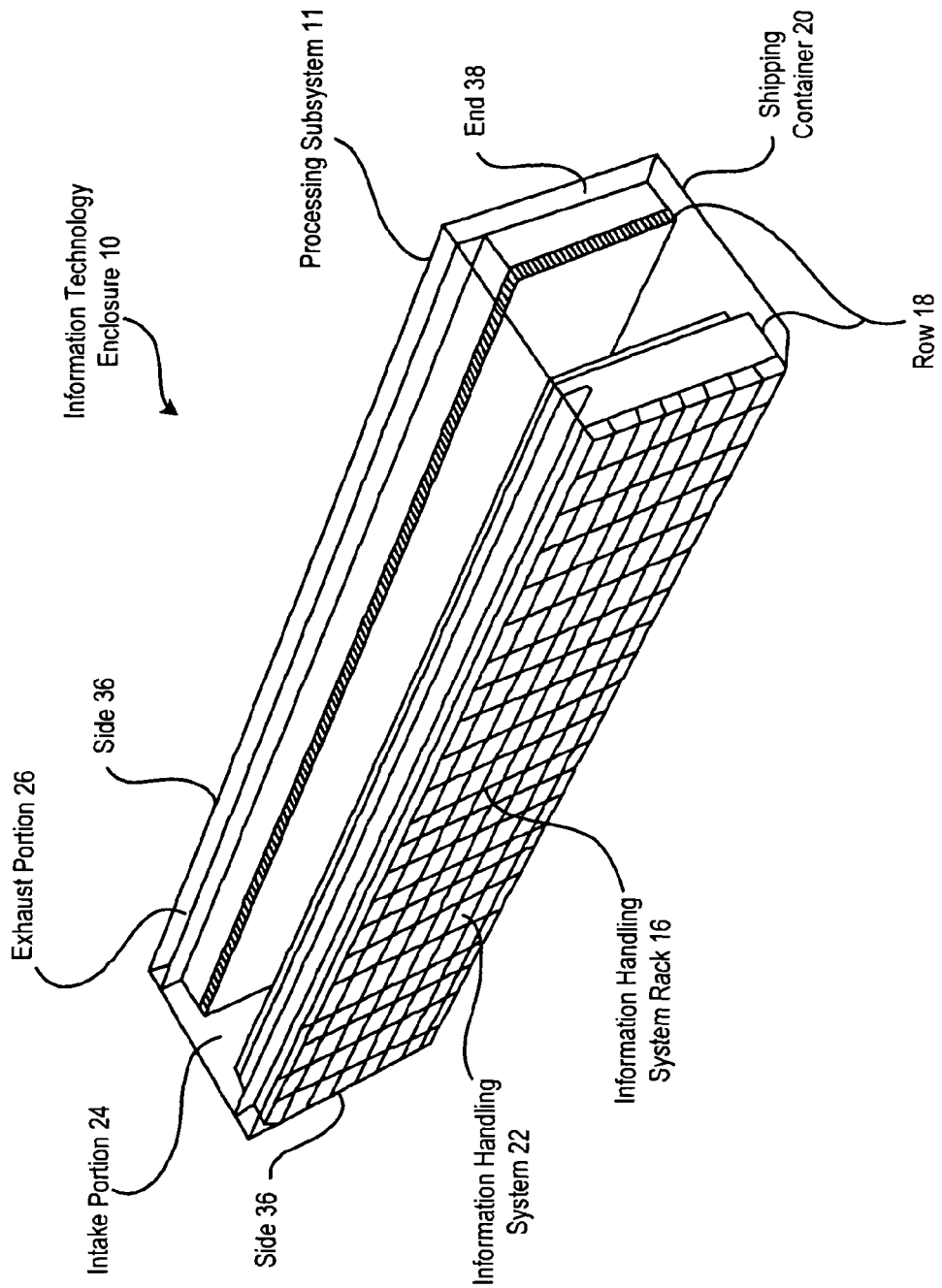
FIGS. 2A and 2B depict perspective cutaway views of an information technology enclosure having increased information handling system density.
Figure 2B:
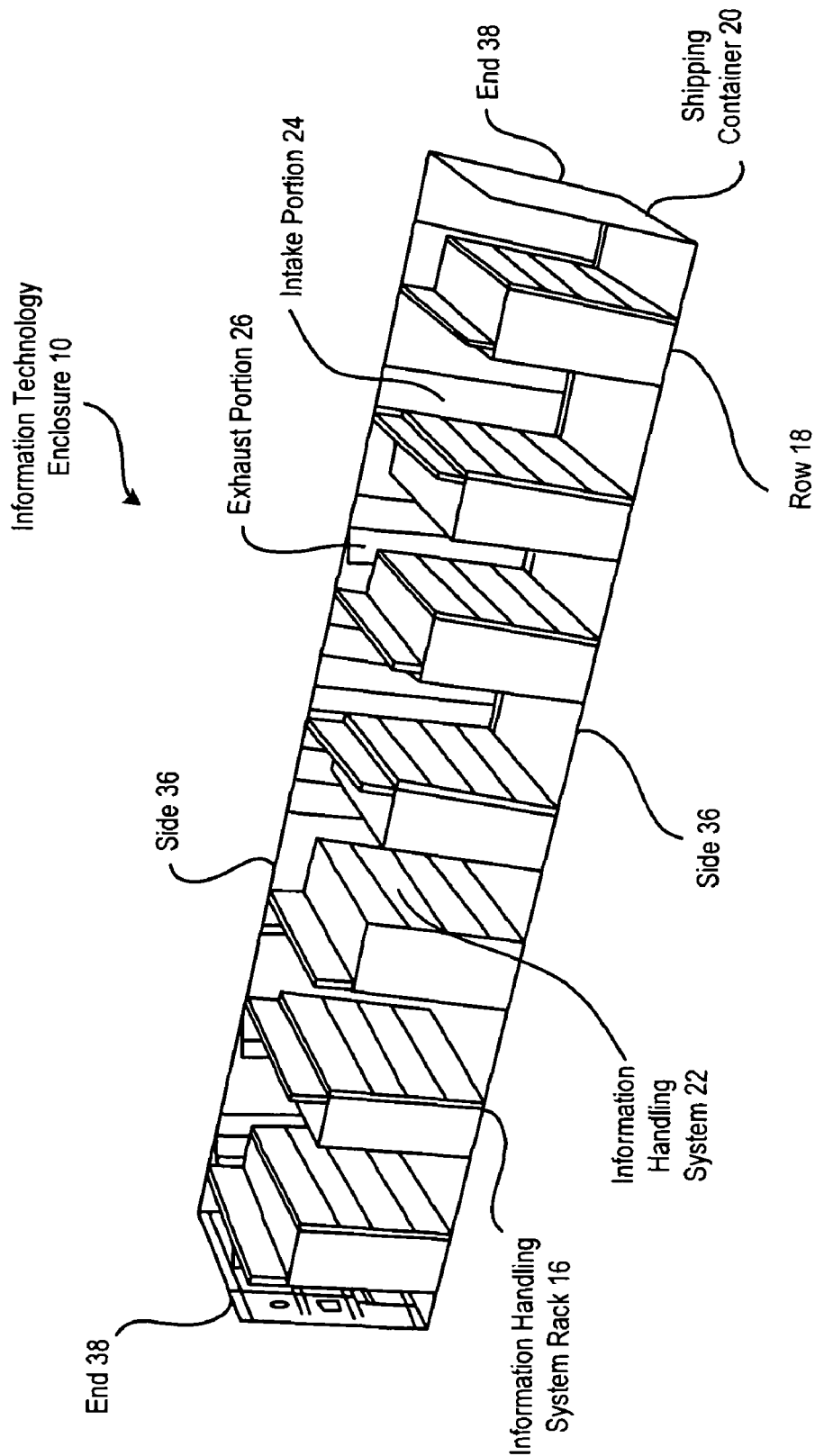

Referring now to FIGS. 2A and 2B, a perspective cutaway view depicts an information technology enclosure 10 processing subsystem 11 having increased information handling system 22 density. By moving supporting infrastructure, such as power and air moving equipment, outside of the shipping container 20 of processing subsystem 11, all of the room within shipping container 20 is available for use by information handling systems 22 and racks 16, thus allowing an increased density of information handling systems 22. Air blowing of chilled or heated air is provided from a location external to the shipping container 20 of processing subsystem 11. For example, a second shipping container 20 that contains supporting infrastructure in an infrastructure subsystem 12 may be placed over top or underneath processing subsystem 11 so that air movers in the infrastructure subsystem provide air flow through openings formed in the shipping containers 20 that align when assembled. Alternatively, an infrastructure subsystem provides supporting infrastructure by placement along one or more of the sides 36 or ends 38 of shipping container 20 of processing subsystem 11. FIG. 2A depicts information handling system racks 16 aligned in two rows 18 that run from end 38 to opposing end 38 of shipping container 20 parallel with sides 36 running the length of shipping container 20. The area defined in shipping container 20 between rows 18 form an intake portion 24 into which an infrastructure subsystem 12 blows cooling air that travels through information handling systems 22 and into an exhaust portion 26 along each side 36 of shipping container 20. In an alternative embodiment, the area between rows 18 define an exhaust portion while cooling airflow is blown along sides 36 of shipping container 20 to flow through information handling systems 22 and into the central portion of shipping container 20. FIG. 2B depicts information handling system racks 16 aligned in plural rows 18 that run from side 36 to opposing side 36 of shipping container 20 perpendicular to the length of shipping container 20. Intake portions 24 are formed between rows 18 by having information handling systems 22 of opposing rows 18 face intake vents towards each other. Exhaust portions 26 are formed between rows 18 by having information handling systems 22 of opposing rows face exhaust vents towards each other. An infrastructure subsystem provides cooling airflow to intake portions 24 with vents formed in the floor, ceiling or sides of shipping container 20 adjacent intake portions 24, and receives exhaust with vents adjacent exhaust portions 26. To facilitate access to information handling systems 22, all or portions of sides 36 and ends 38 of the embodiments of FIGS. 2A and 2B are removable. Additionally, sides 36 and ends 38 may have vents to an external environment formed to aid thermal transfer or air side economization as described with respect to FIG. 1. For example, side vents formed along rows 18 of FIG. 2A allow air to enter through sides 36, pass through information handling systems 22 and exit through the center of rows 18 with a vent in end 38 or through the ceiling or floor of shipping container 20. Increasing density of information handling systems 22 in a shipping container 20 provides a cost effective solution for enterprises that have existing power and thermal transfer resources already available for the information handling systems 22.

Figure 3:
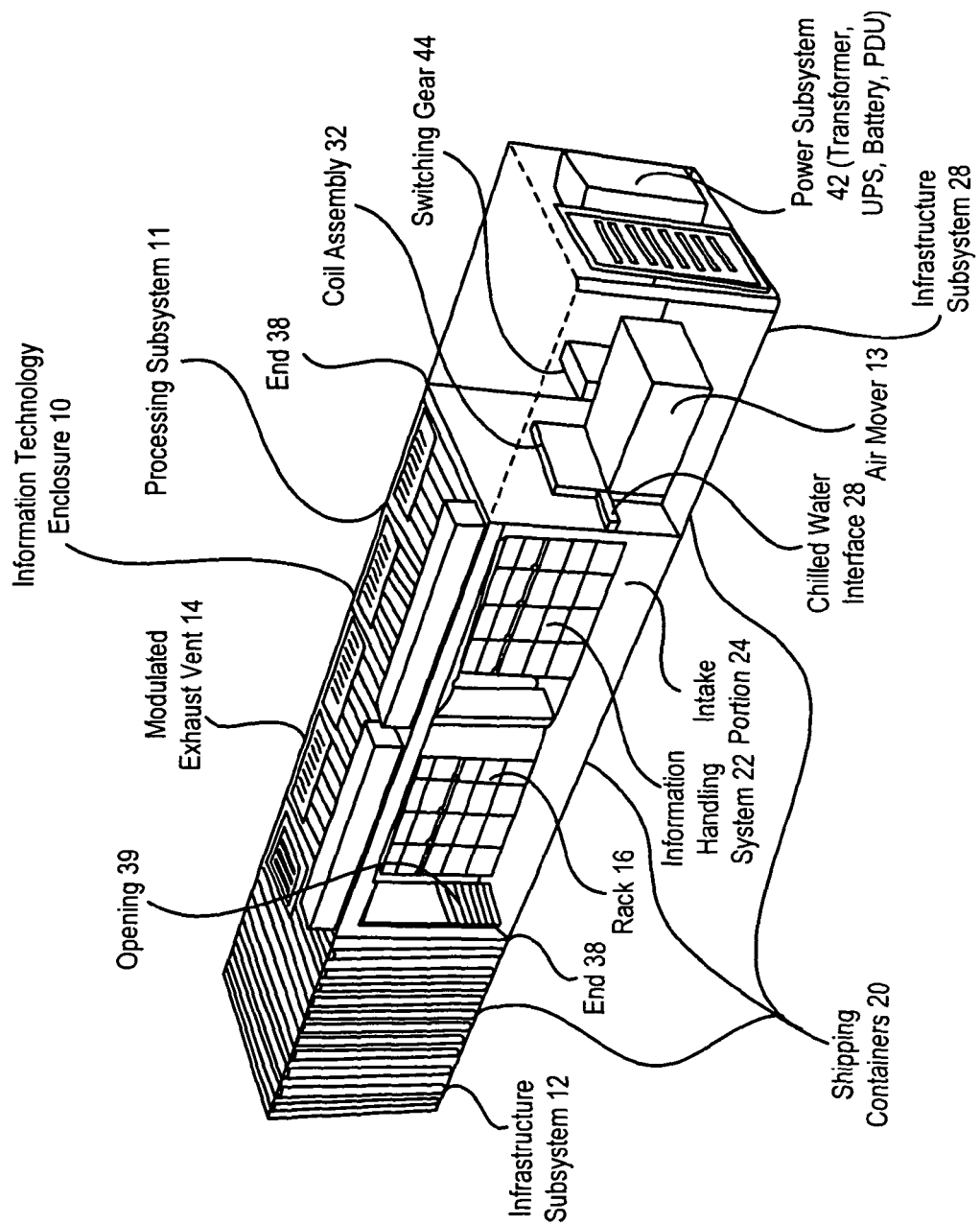
FIG. 3 depicts a perspective cutaway view of an information technology enclosure having an infrastructure subsystem at each end of a processing subsystem to provide thermal transfer and power infrastructure.

Referring now to FIG. 3, a perspective cutaway view depicts an information technology enclosure 10 having dual infrastructure subsystems 12 at each end 38 of processing subsystem 11 to provide thermal transfer and power infrastructure. Information technology enclosure 10 has increased information handling system 22 density within a shipping container 20 by distributing thermal transfer and power infrastructure to a shipping container 20 or other location external to the shipping container 20 that contains information handling systems 22. In the example embodiment depicted by FIG. 3, air movers 13 blows air through coil assembly 32 to push treated air into processing subsystem 11. Coil assembly 32 interfaces with an external HVAC system to receive chilled or heated water through a chilled water interface 28. A power subsystem 42 includes power infrastructure to support operation of the information handling systems 22, such as a transformer, an uninterruptible power supply (UPS) and battery for backup power and a power distribution unit (PDU). Switching gear 44 interfaces network connections for the information handling systems 22 with external networks, such as the Internet or an enterprise intranet. Openings 39 formed in the ends 38 of the shipping containers 20 that hold infrastructure subsystem 12 and processing subsystem 11 align to allow connections to support power and thermal infrastructure provisioning to information handling systems 22. Modulated exhaust vents 14 formed in the ceiling of shipping container 20 support air side economization where ambient conditions allow. In operation, each shipping container 20 of information technology enclosure 10 is manufactured to include information handling systems, power or thermal transfer components and then shipped via conventional transportation to a desired location, such as by rail or truck. Once at the desired location, information technology enclosure 10 having one or more processing subsystems 11 and one or more infrastructure subsystems 12 are unloaded in aligned positions to connect power and thermal transfer infrastructure resources with information handling systems 22. End-to-end configurations such as that depicted by FIG. 3 are convenient for unloading where adequate space is available for the modules. Limitations in available space may be addressed with the stacked configurations described herein.

Figure 4:
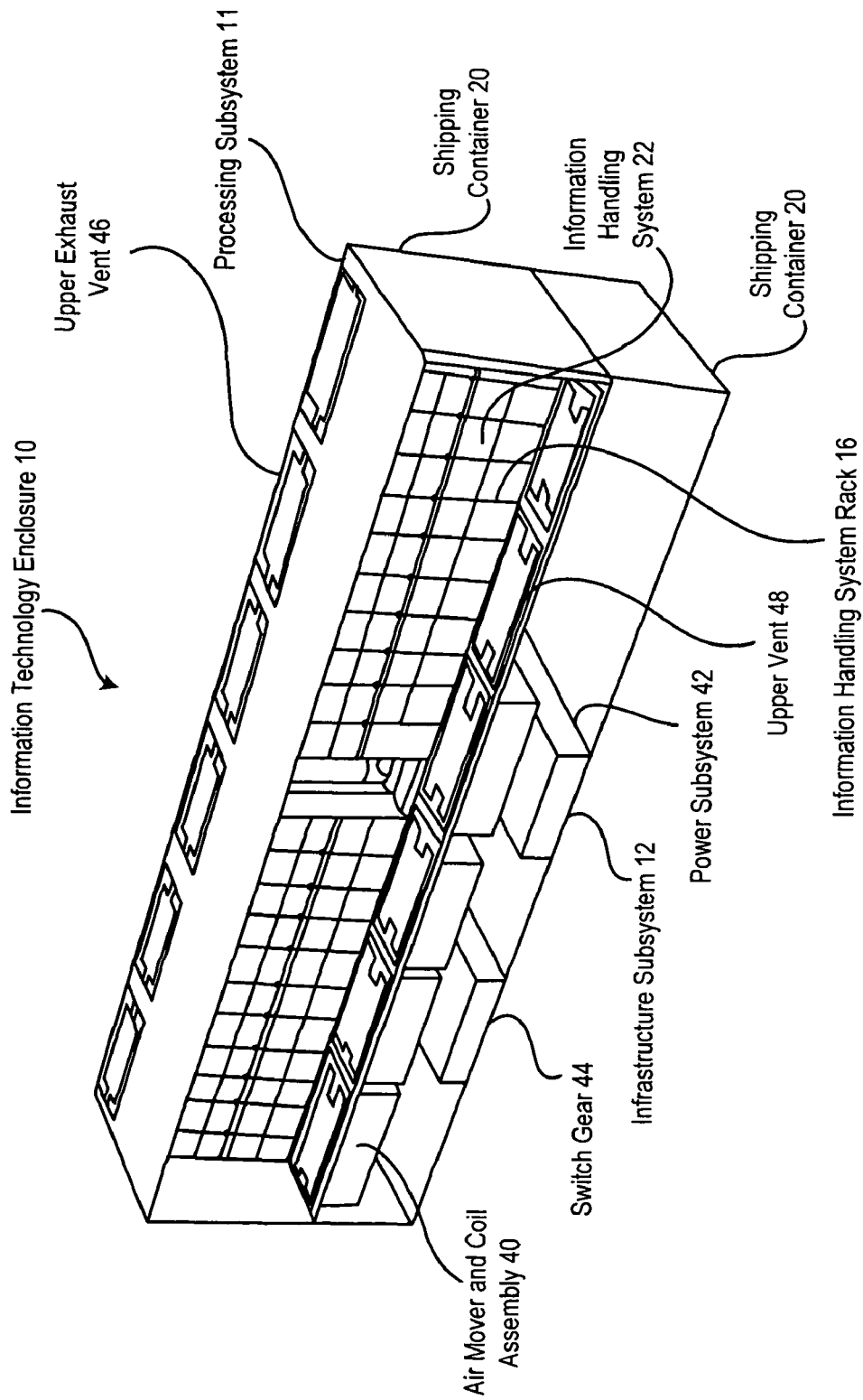
FIG. 4 depicts a perspective cutaway view of an information technology enclosure having a processing subsystem stacked over top of an infrastructure subsystem that provides thermal transfer and power infrastructure.

Referring now to FIG. 4, a perspective cutaway view depicts an information technology enclosure 10 having a processing subsystem 11 in a full height shipping container 20 stacked over top of an infrastructure subsystem 12 in a half-height shipping container 20. Infrastructure subsystem 12 provides thermal transfer and power infrastructure to processing subsystem 11. Stacking processing subsystem 11 over the top of infrastructure subsystem 12 reduces the overall footprint of the assembled information technology enclosure 10 relative to the end-to-end configuration depicted in FIG. 3. The stacked configuration also provides convenient alignment of openings formed in the upper surface ceiling of infrastructure subsystem 12 and the lower surface floor of processing subsystem 11. Infrastructure subsystem 12 upper vent 48 allows air pushed by air mover and coil assemblies 40 to enter at a lower surface of processing subsystem 11 similar to the manner used by plenums in conventional data centers. When using air side economization, external air provided through infrastructure subsystem 12 upper vent 48 moves through information handling systems 22 and out upper exhaust vents 46 formed in the ceiling of processing subsystem 11. Although FIG. 4 depicts processing subsystem 11 stacked over infrastructure subsystem 12, in alternative embodiments, infrastructure subsystem 12 may stack over top of processing subsystem 11 and plural layers of infrastructure and processing subsystems may be stacked over each other.

The stacked configuration depicted by FIG. 4 allows very high density levels of information handling systems 22 in a shipping container 20 by concentrating information handling systems in one shipping container 20 while providing support infrastructure in a separate shipping container 20, such as air mover and coil assembly 40, switching gear 44 and power subsystems. For example, in one embodiment, information technology enclosure 10 includes substantially only racks 16 of information handling systems 22 in a processing subsystem 11 while infrastructure subsystem 12 includes supporting components such as air mover and coil assembly 40, switchgear 44, and a power subsystem 42 having power distribution units, transformers, UPS and battery banks. Further, access remains available to the interiors of the shipping containers 20 through removal of either side or end portions. Thermal transfer for the information technology enclosure 10 may be performed with closed loop operation or air economization as set forth herein. In alternative embodiments, the stacked configuration may be accomplished with infrastructure subsystems 12 placed over the top of processing subsystems 11 and a data center built with shipping containers 20 may stack plural layers of either infrastructure subsystems 12 processing subsystems 11 over top of each other interspersed a variety of orders.

Referring now to FIGS. 5A through 5D, infrastructure subsystems 12 are depicted having plural built-to-order configurations that a data center orders customized to an intended operating environment. For example, based upon the external environment in which it will operate, a data center selects whether to build an infrastructure subsystem 12 with or without filters to filter air accepted at vents, single or multiple heat exchanger coils that add or remove thermal energy from airflow provided by air movers, single or multiple coil assemblies to treat airflow provided by air movers, solid or vented shipping container panels and actuated or non-actuated vents. The build-to-order approach for configuring infrastructure subsystems provides data centers with flexibility to scale out their infrastructure over time, such as to adapt as the characteristics of the data center change over time with the addition or replacement of information handling systems. Further, data centers may build-to-order infrastructure subsystems 12 and processing subsystems 11 designed to address specific information processing tasks, such as search engines or data storage. Manufacture of infrastructure subsystems 12 around a common design having different populations of thermal transfer and power components improves manufacture efficiency and data center continuity over time, such as by allowing existing thermal transfer and power components to adjust to processing subsystems 11 over time. Further, end users can populate an infrastructure subsystem 12 to provide a desired level of redundancy for power and thermal transfer functions.

Figure 5A:
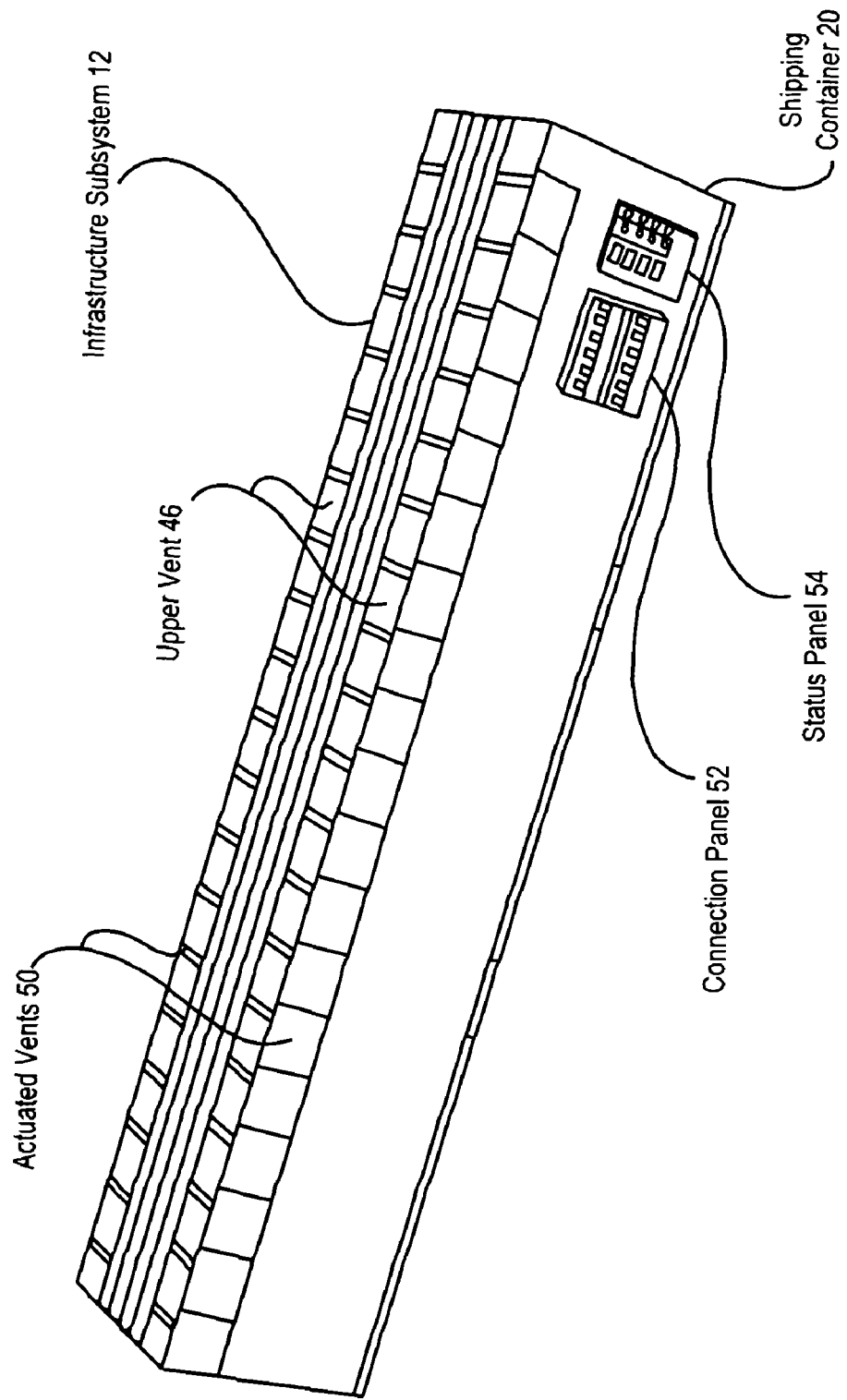
FIGS. 5A through 5C depict an infrastructure subsystem having plural built-to-order configurations that a data center can order customized to an intended operating environment.
Figure 5B:
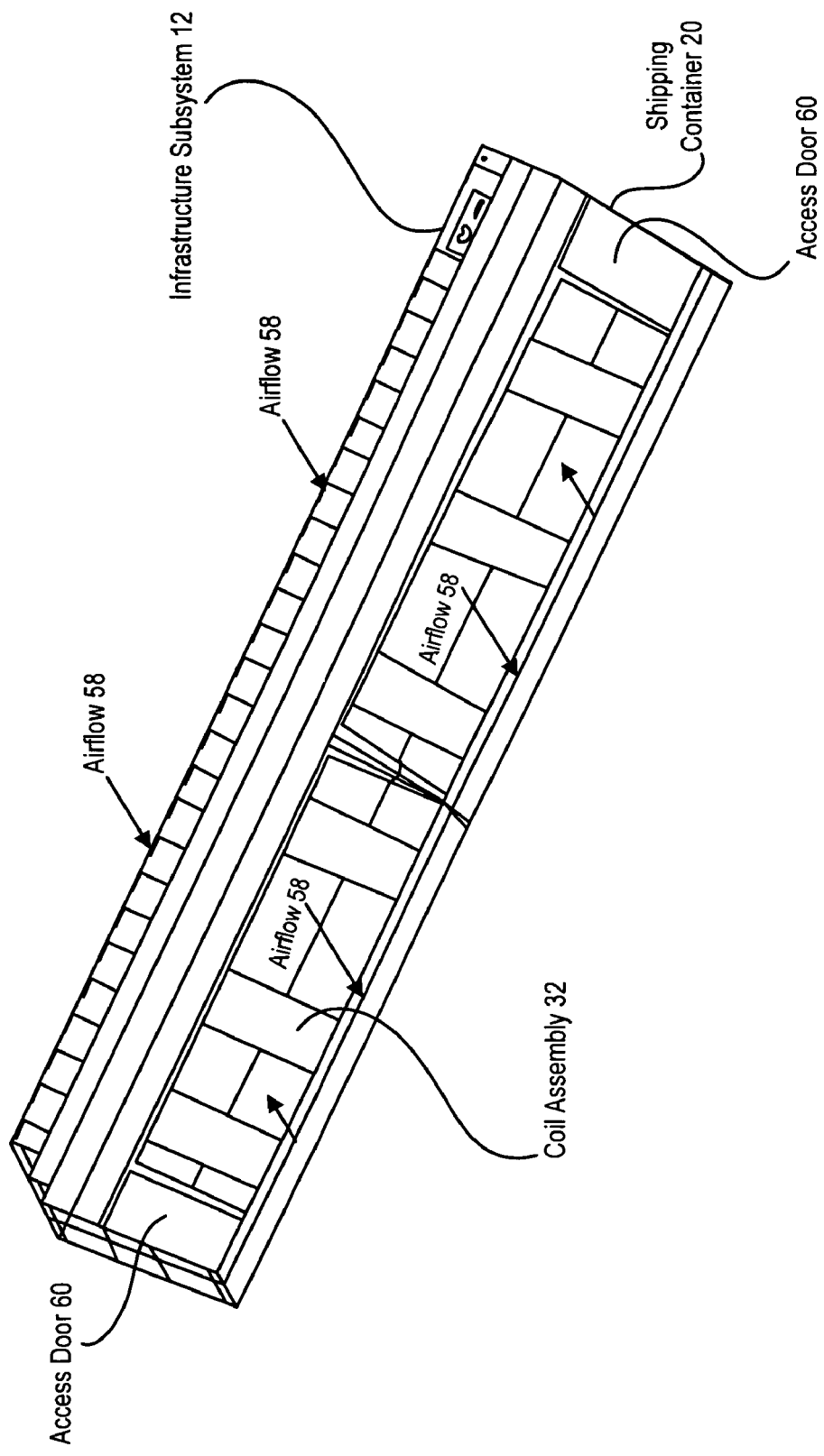
Figure 5C:
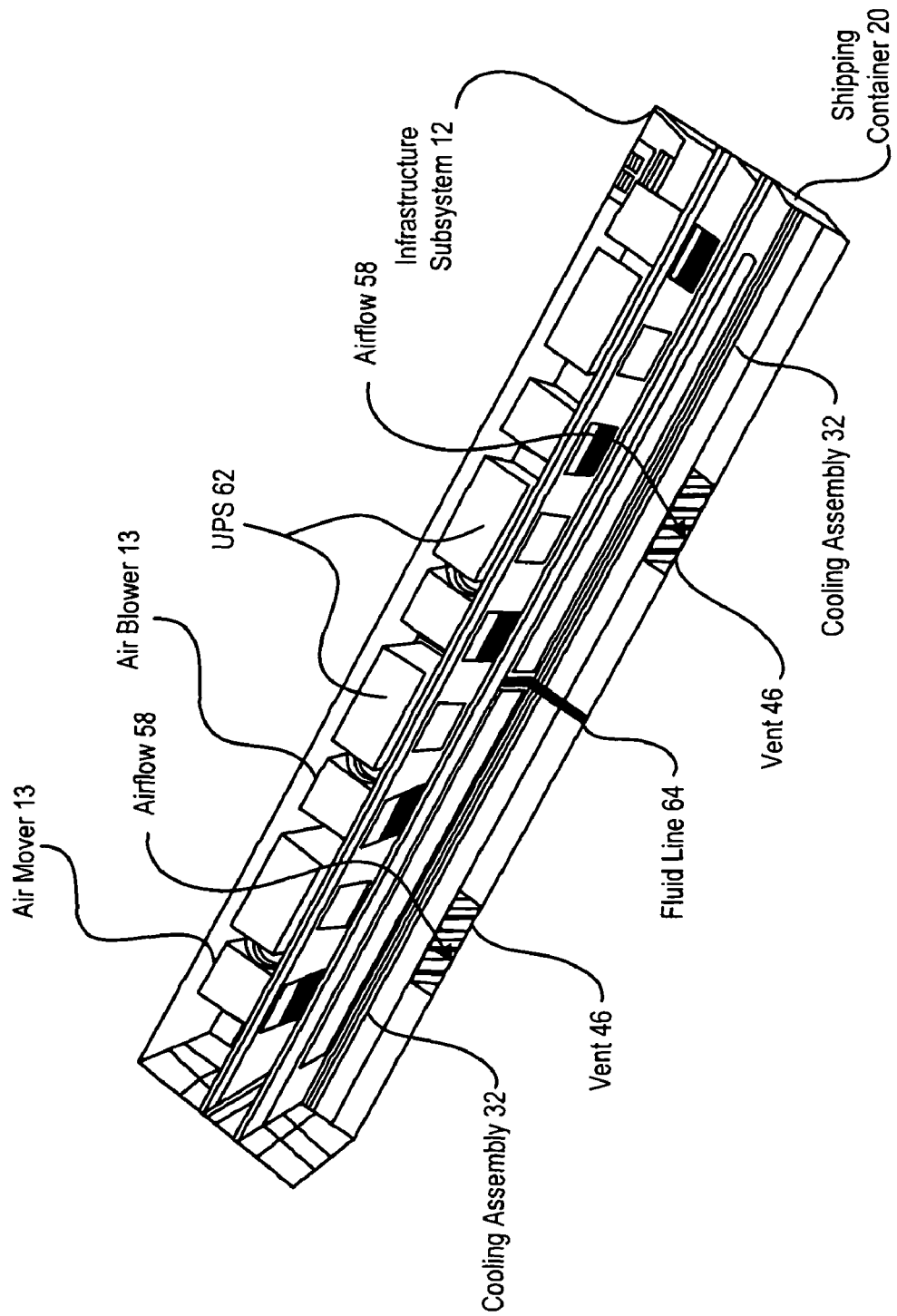

FIG. 5A depicts an upper perspective view of an infrastructure subsystem 12 manufactured in a shipping container 20. Actuated vents 50 located on the upper side panels of shipping container 20 selectively open and close for access to outside air, such as to support air side economization. Upper vents 46 interact with a processing subsystem 11 placed over top of infrastructure subsystem 12 to draw air from the processing subsystem and force air back into the processing subsystem to cool information handling systems. A connection panel 52 provides centrally-located connectors for power, chilled water, network and control connections. A status panel 54 outputs information regarding the status of equipment within infrastructure subsystem 12. FIG. 5B depicts an upper perspective view of an infrastructure subsystem 12 with a side panel of shipping container 20 removed for access to infrastructure equipment. Coil assemblies 32 accept chilled water from an external source, such as an external HVAC system. Airflow, represented by arrows 58, is received from an upper vent to pass through coils 32 where the airflow is cooled before being directed back upwards to a processing subsystem 11 to cool information handling systems. In alternative embodiments, coils 32 accept heated water to provide thermal energy where the operating temperatures are too low for information handling systems. Further, coils 32 might include an evaporator to remove or add moisture to airflow 58. Access doors 60 allow access for maintenance work to equipment within supporting module 40. FIG. 5C depicts a top cutaway view of an infrastructure subsystem 12 that rests over the top of a processing subsystem 11. Air movers 13 draw air into infrastructure subsystem 12 from vents located at the floor of shipping container 20 and push airflow 58 through coil assemblies 32 and back down into the processing subsystem through vents 46. Disposing cooling coils in a vertical configuration along the length of supporting module 40 provides increased surface area for thermal transfer of energy from airflow 58. Back-up power UPS units 62 provide power for a limited time period in the event that power to a mobile information handling system module is cutoff. A cooling fluid line 64 accepts a cooling fluid, such as chilled or heated water, tap water, refrigerants glycol or other types of fluids, from a source external to shipping container 20 for distribution through coil assemblies 32.

Referring now to FIGS. 6A through 6D, a information technology enclosures 10 are depicted having enthalpy wheels 64 to assist thermal transfer from within a shipping container 20 to outside the shipping container 20, such from a processing subsystem 11 or an infrastructure subsystem 12. One source of significant energy consumption for data centers under most environmental conditions is energy for removing heat from information handling systems during normal operations. Typical data centers use dedicated HVAC equipment to cool the air provided to the information handling systems so that sufficient heat is removed from the information handling systems. Enthalpy wheel 64 helps to reduce energy consumption for cooling airflow to information handling systems by passively absorbing heat from within an information technology enclosure 10 for release to the outside environment. Enthalpy wheels take advantage of external temperatures that are cooler than internal temperatures by transferring heat with the wheel material while maintaining external and internal air separate from each other to avoid contamination or foreign material intrusion. In addition to reducing energy consumption for removing heat, enthalpy wheel 64 reduces the equipment requirements for cooling a given information technology enclosure, thus reducing the overall cost of setting up the information technology enclosure. Air movers push or pull air across the enthalpy wheel to aid heat transfer while a small motor causes the wheel to turn. Enthalpy wheel movement may be aided my internal air movement and, in a windy environment, external wind may cause the enthalpy wheel to turn. When within shipping container 20, enthalpy wheel blades 66 absorb heat. As the enthalpy wheel 64 turns to place the blade 66 into the external environment, the blade 66 releases heat. Enthalpy wheels 64 may be used alone, with air movers and with HVAC equipment, depending upon the external environment.

Figure 6A:
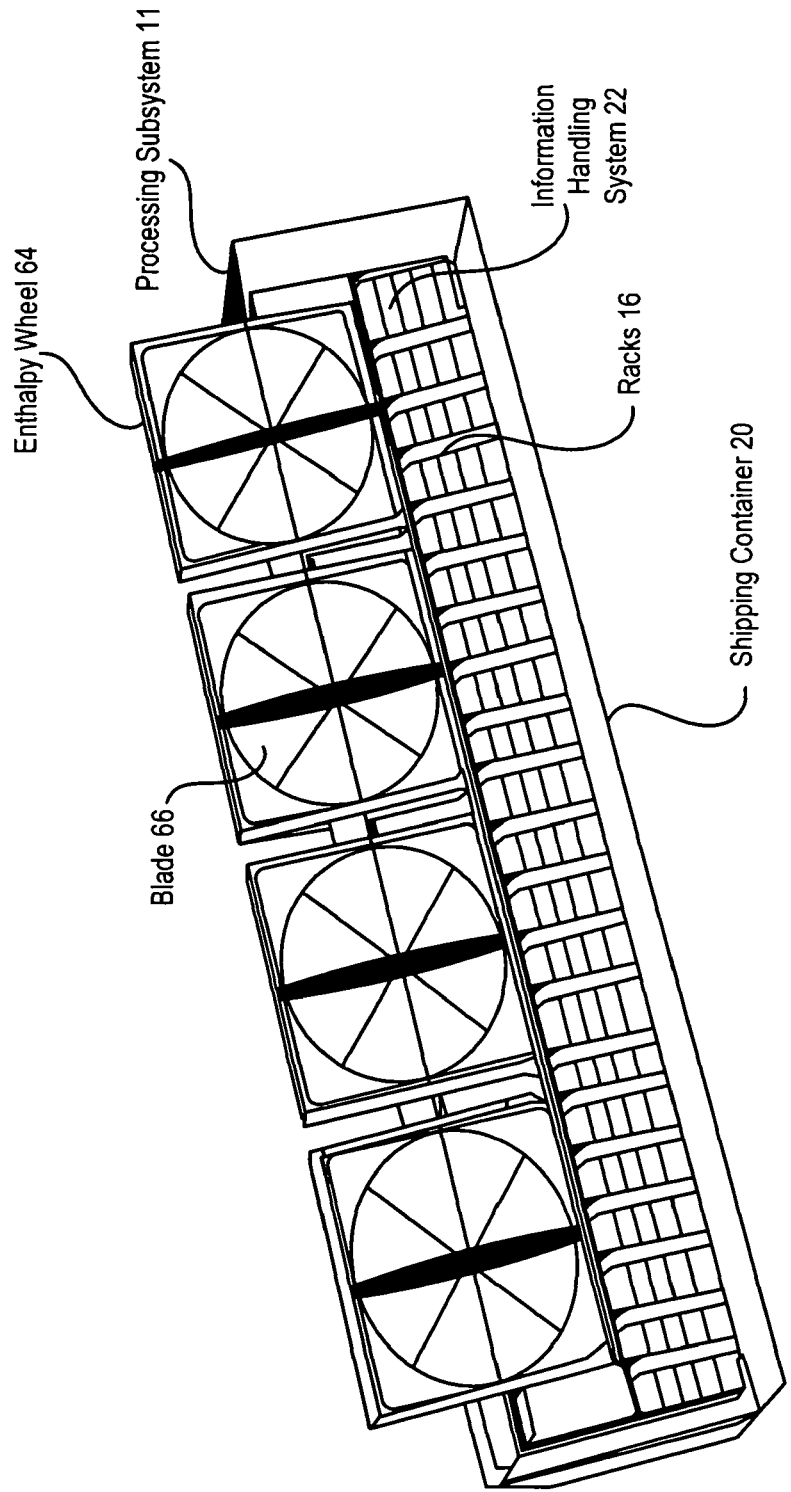
FIGS. 6A through 6D depict a processing subsystem or infrastructure subsystem having enthalpy wheels to assist thermal transfer of heat from within a shipping container to outside the shipping container.

FIG. 6A depicts a side cut away view of a processing subsystem 11 having plural information handling systems 22 operating in racks 16 within a shipping container 20. Enthalpy wheels 64 are disposed within processing subsystem 11 so that approximately one-half of each enthalpy wheel 64 is exposed to the external environment and one-half is exposed to the environment within shipping container 20.

Figure 6B:
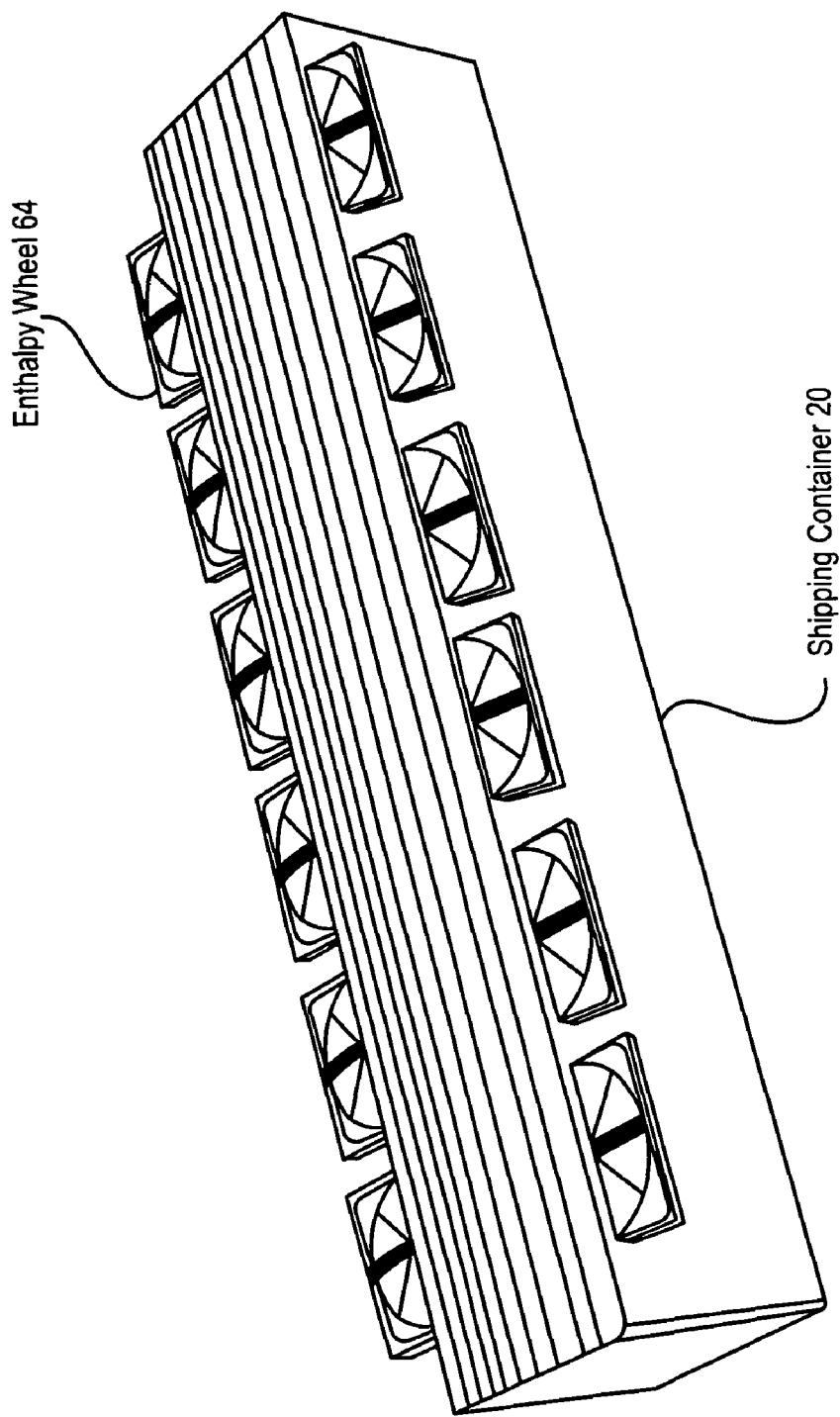
Figure 6C:
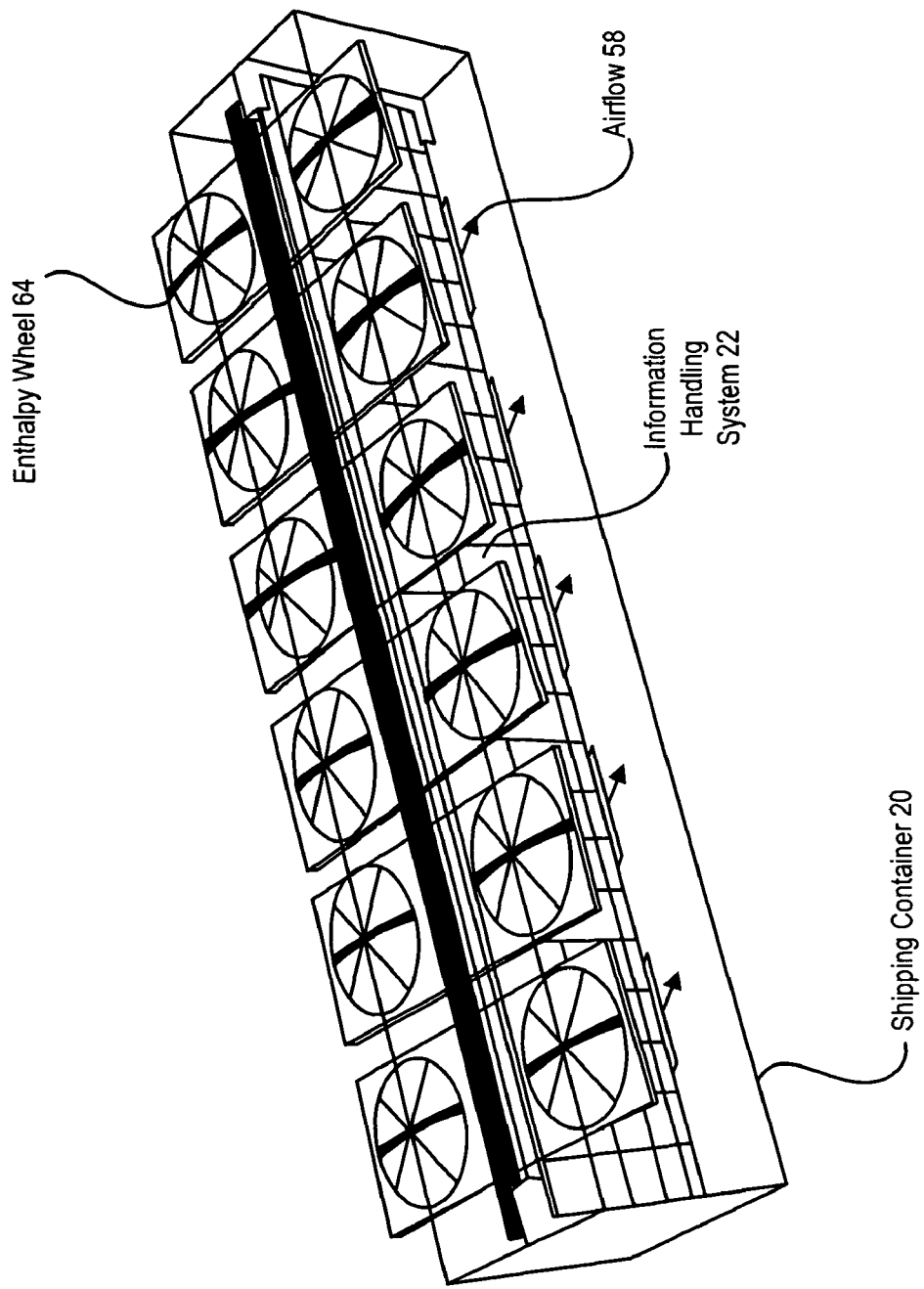
Figure 6D:
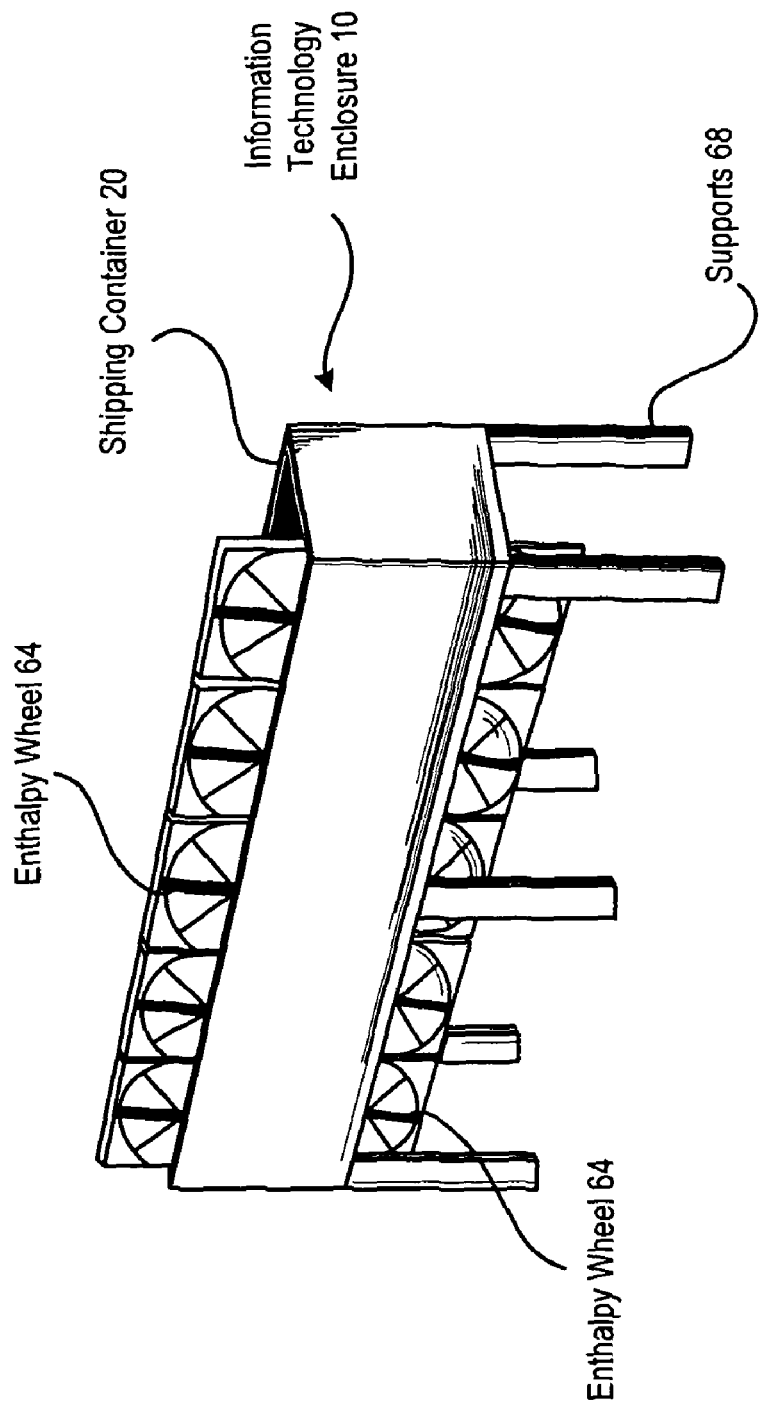

As enthalpy wheel 64 turns, blades 66 absorb thermal energy from within shipping container 20 and then rotate to release thermal energy to the external environment. The example embodiment of FIG. 6A has enthalpy wheels 64 oriented in a vertical configuration relative to shipping container 20. Blades 66 turn due to a motor located outside the shipping container and, in some instances, by airflow within shipping container 20, such as airflow created by cooling fan exhaust or air movers. FIG. 6B depicts enthalpy wheels 64 disposed in a horizontal configuration relative to shipping container 20. Enthalpy wheels 64 may be incorporated in either processing subsystem 11 or infrastructure subsystem 12. For example, enthalpy wheel 64 rotates within the portion of an infrastructure subsystem that accepts air from the exhaust portion of a processing subsystem. The cut away view of FIG. 6C depicts an airflow 58 generated by air movers that passes either cooled air or external air through information handling systems 22. Airflow 58 is, for instance, directed across blades 66 of enthalpy wheels 64 and then routed to pass by cooling coils for recycling through information handling systems 22. Removal of part of the heat from the airflow by enthalpy wheels 64 reduces the amount of heat that the cooling coils must collect, thus reducing cooling costs. FIG. 6D depicts another embodiment in which an information technology enclosure 10 is raised by supports 68 so that a first set of enthalpy wheels extends from an upper portion of shipping container 20 and a second set of enthalpy wheels 64 extends from a lower portion of shipping container 20. Supports 68 raise shipping container 20 to allow access of enthalpy wheels 64 to external wind, although air may also be pushed or pulled across enthalpy wheels 64 to remove some thermal energy before passing across cooling coils to remove additional thermal energy so that the amount of thermal energy in the air is reduced before the air is exposed to the cooling coils.

Figure 7:
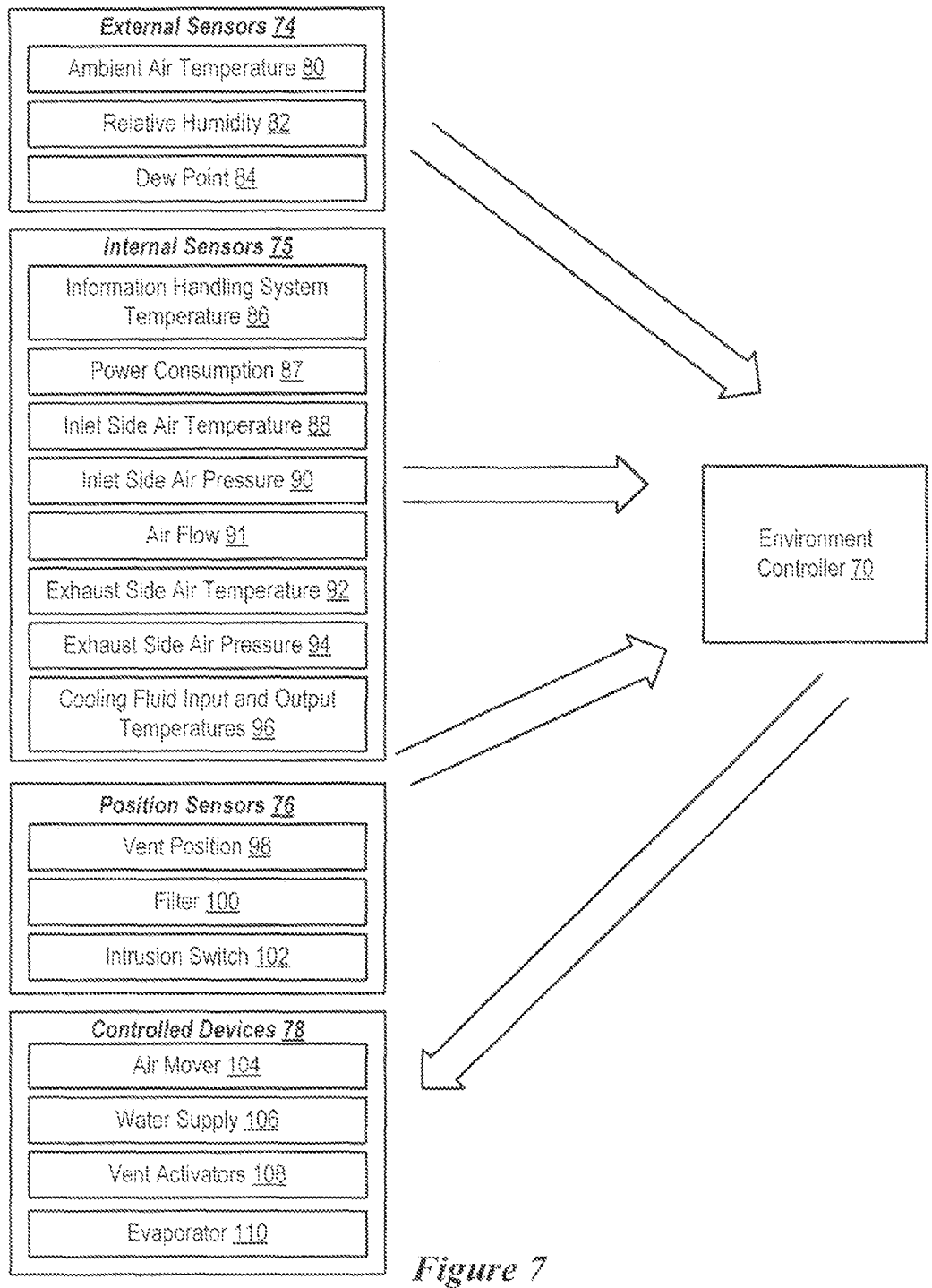
FIG. 7 depicts a block diagram of an environment controller that applies information from multiple sensors to control the environment within a processing subsystem.

Referring now to FIG. 7, a block diagram depicts an environment controller 70 that applies information from multiple sensors to control the environment within a processing subsystem. Environmental controller 70 is, for instance, a software module that resides on an information handling system running in an information technology enclosure, a processing subsystem or an infrastructure subsystem or a distant location interfaced through a network connection, such as an Internet connection. Environmental controller 70 accepts inputs from external sensors 74, internal sensors 75 and position sensors 76 to determine environmental conditions associated with information handling systems under its control, and manages the environmental conditions by commands to controlled devices 78. External sensors 74 include ambient air temperature sensors 80 to determine the temperature of the external environment, relative humidity sensors 82 to determine the relative humidity of the external environment and dew point sensors 84 to determine the dew point of the external environment. Environment controller 70 applies conditions sensed by external sensors 74 to determine whether to operate in a closed loop or air economization configuration. Internal sensors 75 sense conditions within an information technology enclosure, processing subsystem or infrastructure subsystem. Information handling system temperature sensors 86 sense the operating temperature of information handling systems, such as is provided by internal sensors to the BIOS, baseboard management controller (BMC) or other firmware operating on information handling systems and available through out-of-band network communications. Power consumption sensor 87 detects power consumed at the shipping container, such as for instances where power must be shut down, like during an over temperature condition. Inlet side air temperature sensor 88 and inlet side air pressure sensor 90 determine the temperature and pressure of treated air that is fed into the information handling systems under control. Airflow sensors 91 detect the air velocity through or near one or more information handling systems. Exhaust side air temperature sensor 92 and exhaust side air pressure sensor 94 determine the temperature and pressure of air exhausted from the information handling systems under control. Cooling fluid input and output temperature sensors senses the temperature of the cooling fluid before and after cooling, such as near the point through which air is pushed before the air proceeds through the information handling systems.

Environmental controller 70 applies the information from external sensors 74 and internal sensors 75 to determine appropriate actions for controlled devices 78. During closed loop operations, internal air recycles within the information technology enclosure. Environment controller 70 manages the operation of air movers 104, water supply 106 and evaporator 110 to maintain internal environmental conditions within predetermined constraints. For example, measurements from information handling system temperature sensors 86 are compared against desired maximum and minimum levels to determine the amount and temperature of air that is provided to each information handling system. In one embodiment, a coil and air mover assembly including coils, air movers, motors, valves, control boards, variable frequency drives, sensors, humidity adders, controllable louvers/dampers and power, cooling fluid, and air signal inputs and outputs, interfaces with environmental controller 70 so that environmental conditions are controlled to desired constraints. The amount and temperature of the input air is adjusted by altering the speed at which air movers 104 operate and the temperature of water supply 106. Adjustments are made to minimize energy consumption of thermal control infrastructure. For instance, the amount of chilled water provided by water supply 106 might be decreased by increasing the operating speed of air movers 104, thus reducing energy consumption by external HVAC equipment. In some circumstances, energy consumed by thermal control infrastructure is reduced by transitioning to passive thermal management, such as air economization, which initiates the supply of external air to the information technology enclosure 10 and/or the exhausting of internal air from information technology enclosure 10. Environment controller 70 introduces external air with vent actuators 108 that actuate vents to open positions as measured by vent position sensor 98. In one embodiment, environmental controller 70 applies passive thermal management by determining whether to deploy and operate entropy wheels. A filter sensor 100 determines the presence or absence of a filter to determine whether external air flow is restricted. Whether operating in a closed loop mode or air economization mode, evaporator 110 is available to reduce humidity by running chilled water through the evaporator and removing condensation or to aid humidity by providing water for evaporation. An intrusion switch 102 detects opening of an access door so that environment controller 70 can alter operations to optimize cooling with the access door open, such as by increasing the speed of air movers 104.

Figure 8A:
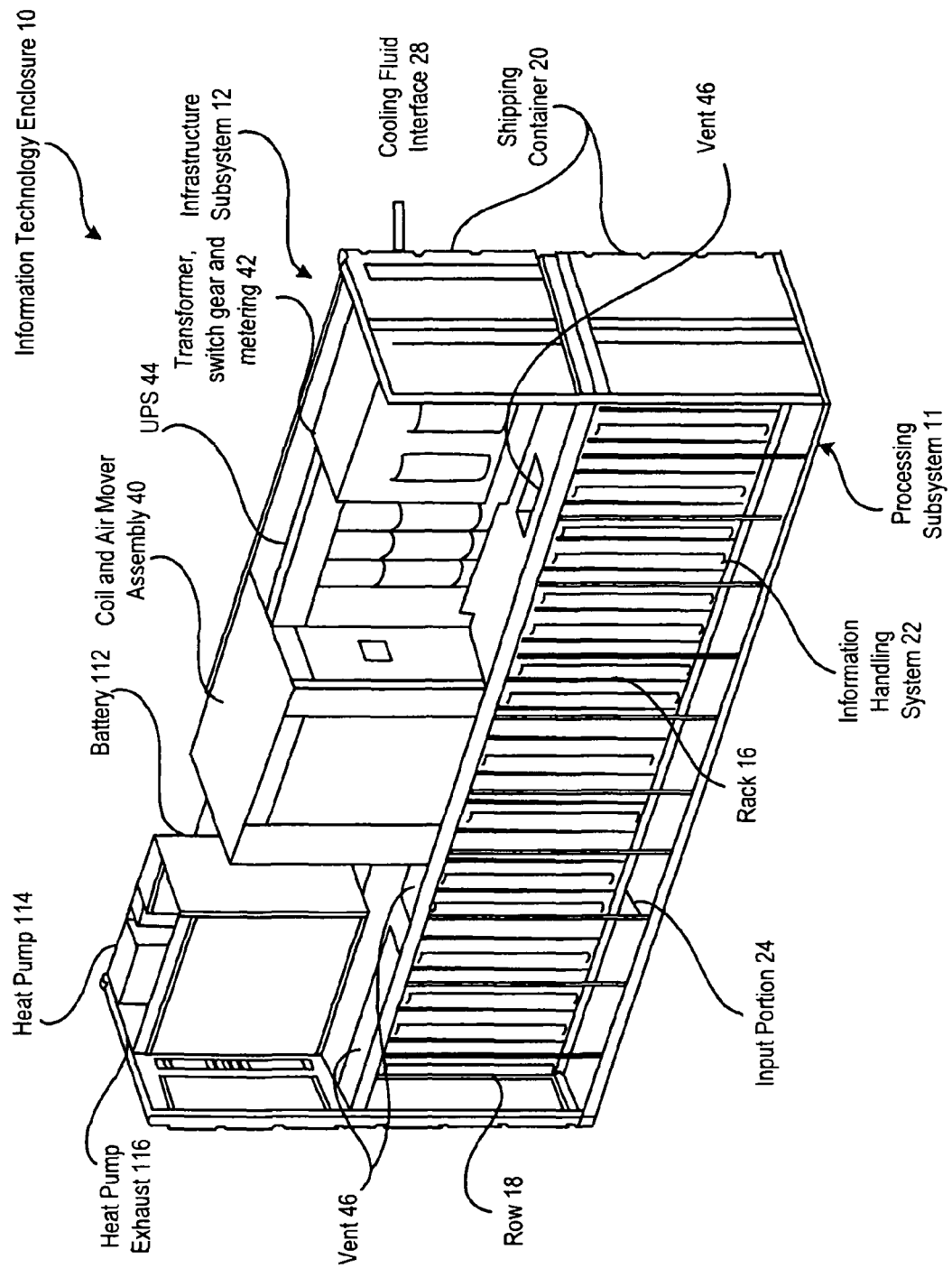
FIG. 8A depicts a front perspective view of an information technology enclosure.

Referring now to FIG. 8A, a front perspective view depicts an information technology enclosure 10 having an infrastructure subsystem 12 and processing subsystem 11 in a stacked configuration. Each of the processing subsystem 11 and infrastructure subsystem 12 are built in a forty foot shipping container 20. Infrastructure subsystem 12 rests over top processing subsystem 11 so that vents 46 in the floor of infrastructure subsystem 12 align with vents in the ceiling of processing subsystem 11. A single row 18 of racks 16 support plural information handling systems 22 to divide processing subsystem 11 along the length of shipping container 20 into an input portion 24 in the front and an exhaust portion 26 in the rear. Information handling systems 22 pull air from the intake portion 24 and exhaust air to the exhaust portion 26. In the example embodiment of FIG. 8A, racks 16 provide 1296 U's of space with 24 full depth 54U nineteen inch racks. Racks 16 hold up to 2408 server information handling systems 22, such as 604 2U chassis with switches, serial connectors and environment managers. In the embodiment of FIG. 8A, information handling systems 22 are optimized for a predetermined function, such as a search engine function or a data storage function. By populating racks 16 with homogeneous systems having a common function, infrastructure to support operations of the systems is more predictable and less expensive.

Figure 8B:
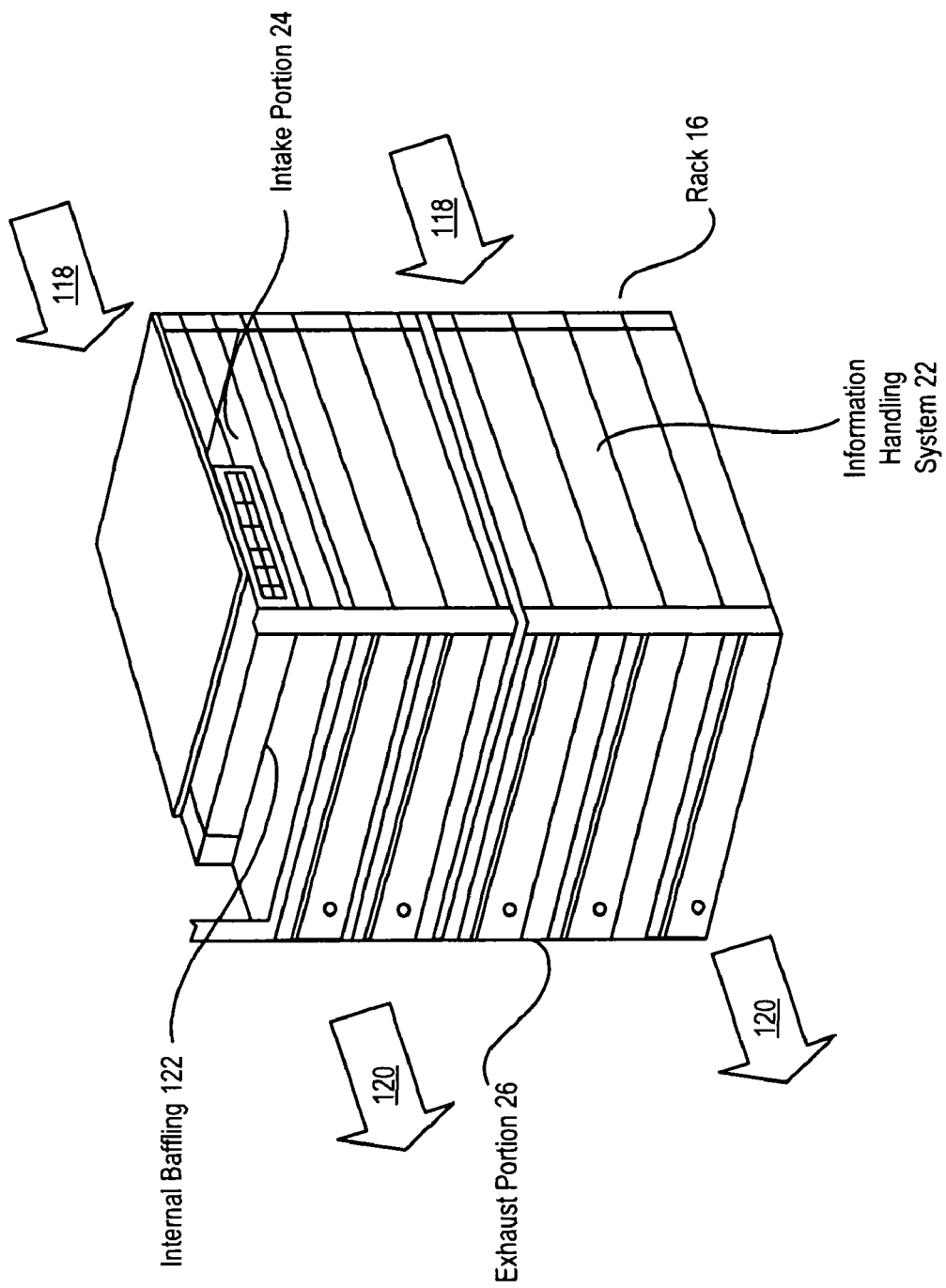
FIG. 8B depicts information handling systems in a rack with supply and exhaust air.

Infrastructure subsystem 12 has a coil and air mover assembly 40 which blows treated air into intake portion 24 and receives exhaust from exhaust portion 26. Coil and air mover assembly 40 may include any of multiple types of air movers, such as direct axial, plenum or impeller air movers. Coil and air mover assembly 40 relies on a source external to shipping containers 20 for chilled water that cools air directed into intake portion 24. For example, a 100 ton air handling unit with air mover redundancy provides air to intake portion 24. In alternative embodiments, multiple types of cooling techniques may be used to cool air moved into intake portion 24, such as chilled water, refrigerant or evaporation cooling. Uninterruptible power supply 44 in infrastructure subsystem 12 include switches to manage power supply to manage power application to infrastructure and information handling system elements and to provide temporary power in the event of a power disruption. A transformer, switch gear and metering module 44 operates on 480 Volts AC 3-phase power and takes high voltage levels to step down for use by lower voltage components. A backup uninteruptable power supply is provided with a battery 112 having a four minute life. Battery 112 has a heat pump 114 and heat pump exhaust 116 to maintain a proper operating temperature. Referring now to FIG. 8B, information handling systems 22 are depicted in a rack 16 with supply air 118 and exhaust air 120. Chilled air from intake portion 24 provides supply air 118 which is forced through information handling systems 22 by internal cooling fans and an overpressure present at intake portion 24. Internal baffling 122 prevents airflow between intake portion 24 and exhaust portion 26 except through information handling systems 22. In one embodiment, an end user orders processing and infrastructure modules built to order by specifying the inclusion or exclusion of various elements in the processing and infrastructure enclosures. For example, an end user who already has resources for power step down, UPS or other elements, those elements might be removed from the infrastructure enclosure.

Although the present invention has been described in detail, it should be understood that various changes, substitutions and alterations can be made hereto without departing from the spirit and scope of the invention as defined by the appended claims.

What is claimed is:

1. A system for processing information, the system comprising:
    a processing subsystem shipping container;
    plural racks disposed in the processing subsystem shipping container to define one or more intake areas and one or more exhaust areas;
    plural information handling systems disposed in the racks and operable to process information; and
    one or more intake vents formed in the processing subsystem shipping container in communication with the one or more intake areas;
    one or exhaust vents formed in the processing subsystem shipping container in communication with the one or more exhaust areas; and
    an infrastructure subsystem shipping container having one or more air movers aligned to blow air into the one or more intake vents of the processing subsystem shipping container and to accept air from the one or more exhaust vents of the processing subsystem shipping container.

2. The system of claim 1 further comprising one or more coil assemblies disposed in the infrastructure subsystem shipping container between the one or more air movers and the one or more processing subsystem shipping container intake vents.

3. The system of claim 2 further comprising a chilled water inlet disposed in the infrastructure subsystem shipping container operable to accept chilled water from a source external to the infrastructure subsystem shipping container and to communicate the chilled water to the one or more coil assemblies.

4. The system of claim 3 wherein the plural racks align in first and second rows, the rows parallel with a length of the processing subsystem shipping container, the one or more intake areas formed between the rows and walls running along the length of the processing subsystem shipping container, the one or more exhaust areas formed between the first and second rows.

5. The system of claim 4 wherein the walls running along the length of the processing subsystem shipping container move to provide access to the information handling systems through the one or more intake areas.

6. The system of claim 4 wherein the one or more intake vents and the one or more exhaust vents of the processing subsystem shipping container are formed in a floor of the processing subsystem shipping container and the processing subsystem shipping container rests over the top of the infrastructure subsystem shipping container.

7. The system of claim 4 wherein the one or more intake vents and one or more exhaust vents of the processing subsystem shipping container are formed in a ceiling of the processing subsystem shipping container and the processing subsystem shipping container rests underneath the top of the infrastructure subsystem shipping container.

8. The system of claim 3 wherein the plural racks align in plural rows, the rows perpendicular with a length of the processing subsystem shipping container, the one or more intake areas formed between rows having information handling system intakes, the one or more exhaust area formed between rows having information handling system exhausts.

9. The system of claim 3 wherein the plural racks align in a single row, the row parallel with a length of the processing subsystem shipping container, and wherein information handling systems disposed in the racks have an intake side exposed to the one or more intake areas formed on one side of the row and have an exhaust side exposed to the one or more exhaust areas formed on an opposing side of the row.

10. The system of claim 9 wherein the plural racks seal the one or more intake areas from the one or more exhaust areas so that overpressure of air blown into the one or more intake areas forces air from the intake side of the information handling systems to the exhaust side of the information handling systems without the aid of fans running in the information handling systems.

11. A method for processing information, the method comprising:

operating plural information handling systems in a processing shipping container to process information;

arranging the information handling systems to receive air from one or more intake portions of the processing shipping container and to exhaust air from one or more exhaust portions of the processing shipping container, the one or more intake portions and the one or more exhaust portions isolated from each other; and running one or more air movers in an infrastructure shipping container, the air movers blowing air from the infrastructure shipping container to the one or more intake portions and receiving air from the one or more exhaust portions.

12. The method of claim 11 further comprising:

forming vents in the surface of the processing shipping container and the infrastructure shipping container; and placing the processing and shipping containers in contact with each other to align the vents;

wherein blowing air from the infrastructure shipping container further comprises blowing air through one or more of the vents and into the one or more intake portions with the air movers.

13. The method of claim 12 further comprising accepting air from the processing shipping container through one or more of the vents and into the infrastructure shipping container.

14. The method of claim 13 wherein placing the processing and shipping containers in contact with each other further comprises stacking the processing shipping container over top of the infrastructure shipping container.

15. The method of claim 13 wherein placing the processing and shipping containers in contact with each other further comprises stacking the infrastructure shipping container over top of the processing shipping container.

16. The method of claim 13 further comprising:

disposing a coil assembly in the infrastructure shipping container;

pumping chilled water to the coil assembly from a source external to the infrastructure shipping container; and passing air through the coil assembly to chill the air before the air enters the processing shipping container.

17. The method of claim 11 wherein arranging the information handling systems further comprises arranging the information handling systems in a single row parallel with a length of the processing shipping container, the one or more intake portions between the information handling systems and one side of the processing shipping container and the one or more exhaust portions between the information handling system and an opposing side of the processing shipping container.

18. The method of claim 11 wherein arranging the information handling systems further comprises arranging the information handling systems in first and second parallel rows parallel to a length of the processing shipping container, the one or more exhaust portions defined between the rows.

19. The method of claim 18 further comprising moving a side of the processing shipping container to access the information handling systems.

20. The method of claim 11 wherein arranging the information handling systems further comprises arranging the information handling systems in plural parallel rows perpendicular to a length of the information handling systems.

\* \* \* \* \*